(12) United States Patent
Kim et al.

(10) Patent No.: US 9,715,249 B2
(45) Date of Patent: Jul. 25, 2017

(54) DISPLAY DEVICE WITH HEIGHT ADJUSTMENT STRUCTURE AND TERMINAL HAVING THE SAME

(71) Applicant: SAMSUNG ELECTRONICS CO., LTD., Suwon-si (KR)

(72) Inventors: Beom Han Kim, Seoul (KR); Sung Gi Kim, Suwon-si (KR); You Sik Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 461 days.

(21) Appl. No.: 14/039,266

(22) Filed: Sep. 27, 2013

(65) Prior Publication Data

US 2014/0092568 A1 Apr. 3, 2014

(30) Foreign Application Priority Data

Sep. 28, 2012 (KR) ........................ 10-2012-0108968

(51) Int. Cl.
*G06F 1/16* (2006.01)
*H05K 7/00* (2006.01)
(Continued)

(52) U.S. Cl.
CPC ......... *G06F 1/1601* (2013.01); *F16M 11/046* (2013.01); *F16M 11/28* (2013.01);
(Continued)

(58) Field of Classification Search
CPC .... H05K 7/00; F16M 11/28; F16M 2200/027; G06F 1/1601
See application file for complete search history.

(56) References Cited

U.S. PATENT DOCUMENTS 3,936,026 A * 2/1976 Hampel ................ F16M 11/08
174/70 R
7,389,963 B2 * 6/2008 Cho ....................... F16M 11/26
248/159

(Continued)

FOREIGN PATENT DOCUMENTS

CN 1499536 A 5/2004
CN 1575113 A 2/2005
(Continued)

OTHER PUBLICATIONS

Communication dated Jan. 27, 2016 issued by the European Patent Office in counterpart European Application No. 13184911.9.
(Continued)

*Primary Examiner* — Adrian S Wilson
*Assistant Examiner* — Abhishek Rathod
(74) *Attorney, Agent, or Firm* — Sughrue Mion, PLLC

(57) ABSTRACT

A display device and a terminal having the same are disclosed. The terminal includes a base including a circuit board provided therein, and upper and lower housings, a support configured with one side combined with at least a portion of the lower housing and the other side having a head part configured for combination with a main body of a display, a first hole located on the upper housing and configured for combination with the support, and a second hole located on the circuit board and configured for combination with the support. The display device and the terminal having the same increase combining force between the support and the base and may use the same support and base in main bodies having various sizes, thus simplifying a manufacturing process and reducing part and assembly costs.

20 Claims, 10 Drawing Sheets

(51) Int. Cl.
    *F16M 11/28*     (2006.01)
    *F16M 11/04*     (2006.01)
    *G06F 1/18*     (2006.01)

(52) U.S. Cl.
    CPC ............... *G06F 1/181* (2013.01); *H05K 7/00* (2013.01); *F16M 2200/027* (2013.01); *F16M 2200/048* (2013.01); *G06F 2200/1612* (2013.01)

(56) References Cited

U.S. PATENT DOCUMENTS

| | | | | |
|---|---|---|---|---|
| 8,000,111 | B2* | 8/2011 | Liao | G06F 1/184 361/726 |
| 8,339,776 | B2* | 12/2012 | Takao | F16M 11/08 361/679.21 |
| 2004/0004165 | A1* | 1/2004 | Hong | F16M 11/28 248/132 |
| 2004/0084579 | A1* | 5/2004 | Lee | F16M 11/08 248/125.1 |
| 2004/0084588 | A1* | 5/2004 | Liu | F16M 13/00 248/291.1 |
| 2006/0198097 | A1* | 9/2006 | Kuwajima | H04N 5/775 361/679.21 |
| 2006/0288139 | A1* | 12/2006 | Lee | G06F 1/16 710/62 |
| 2007/0125914 | A1* | 6/2007 | Liou | F16M 11/105 248/122.1 |
| 2007/0215776 | A1* | 9/2007 | Chen | F16B 7/1427 248/404 |
| 2007/0284488 | A1* | 12/2007 | Kim | F16M 11/04 248/133 |
| 2008/0008467 | A1* | 1/2008 | Liu | H04N 5/2251 396/427 |
| 2009/0141450 | A1* | 6/2009 | Sakata | H05K 7/2099 361/697 |
| 2009/0245927 | A1* | 10/2009 | Stahle | B25G 1/04 403/109.5 |
| 2010/0012801 | A1* | 1/2010 | Gillespie | F16M 11/28 248/220.21 |
| 2011/0116218 | A1* | 5/2011 | Choi | H04N 5/64 361/679.01 |
| 2011/0149181 | A1* | 6/2011 | Kim | F16M 11/08 348/836 |
| 2012/0019990 | A1* | 1/2012 | Segar | F16M 11/08 361/679.01 |
| 2012/0032038 | A1* | 2/2012 | Ye | F16M 11/08 248/122.1 |
| 2012/0104192 | A1* | 5/2012 | Huang | B60P 7/15 248/125.2 |
| 2013/0021539 | A1* | 1/2013 | Austin | F16M 11/125 348/836 |
| 2013/0026311 | A1* | 1/2013 | Chen | F16M 13/02 248/125.7 |
| 2013/0075546 | A1* | 3/2013 | Peng | F16M 11/10 248/125.1 |
| 2013/0292527 | A1* | 11/2013 | Mochizuki | F16M 11/10 248/161 |

FOREIGN PATENT DOCUMENTS

| | | |
|---|---|---|
| EP | 0965786 A1 | 12/1999 |
| TW | 200620180 A | 6/2006 |
| TW | 200722819 A | 6/2007 |
| TW | 200736696 A | 10/2007 |

OTHER PUBLICATIONS

Shawn Guffey: "Vizio CA24 All-In-One Disassembly (after the fact)", Oct. 14, 2014 (Oct. 14, 2014), XP054976296, Retrieved from the Internet: URL:https://www.youtube.com/watch?v=84rDXkiu44U [retrieved on Jan. 12, 2016] (4 pages total).

Anonymous: "Amazon.com: Vizio All-in-One CA24-A0 24-Inch Desktop: Desktop Computers: Computers & Accesories", Jun. 15, 2012 (Jun. 15, 2012), XP055240389, Retrieved from the Internet: URL:http://www.amazon.com/VIZIO-All-in-One-CA24-A0-24-InchDesktop/dp/B0088L18S6/ref=cm_cr_pr_product_top?ie=UTF8 [retrieved on Jan. 12, 2016] (5 pages total).

"Samsung NS220 Quick Setup Guide", Dec. 6, 2011 (Dec. 6, 2011), XP055241092, Retrieved from the Internet: URL:http://org.downloadcenter.samsung.com/downloadfile/ContentsFile.aspx?CDSite=UNI_LEVANT&CttFileID=4878770&CDCttType=EM&ModelType=N&ModelName=NS220&VPath=EM/201112/20111206141155088/BN68-03847C-00.pdf [retrieved on Jan. 13, 2016] (2 pages total).

Communication dated May 2, 2017, issued by the European Patent Office in counterpart European Application No. 13184911.9.

Communication dated May 12, 2017, issued by the State Intellectual Property Office of P.R. China in counterpart Chinese Application No. 201310438566.8.

* cited by examiner

DISPLAY DEVICE WITH HEIGHT ADJUSTMENT STRUCTURE AND TERMINAL HAVING THE SAME

CROSS-REFERENCE TO RELATED APPLICATION

This application claims the benefit of Korean Patent Application No. 2012-0108968, filed on Sep. 28, 2012 in the Korean Intellectual Property Office, the disclosure of which is incorporated herein by reference, in its entirety.

BACKGROUND

1. Field

Exemplary embodiments of the present invention relate to a display device and a terminal having the same, which improves a combination structure between a support supporting a main body of a display and a base and improves a height adjustment structure of the support.

2. Description of the Related Art

In general, display devices display an image on a screen, and correspond to a TV, a computer monitor, etc. Recently, a terminal has been manufactured with an integrated display device and a circuit board serving as a controller.

Such a display device and a terminal having the same may include a height adjustment device so as to freely adjust the height thereof, according to surrounding circumstances or user preferences.

When a known display device and terminal having the same height is adjusted, after a display main body is adjusted to a desired height, the display main body is forcibly fixed, which causes inconvenience to a user. Further, as the size of the main body of the display increases, a great amount of force is required to adjust the height of the display main body.

Therefore, use of elastic force in adjustment of the height of the display main body has been proposed, and for this purpose, members, such as springs or cylinders, have been used. However, in this case, different springs or cylinders need to be used according to different sizes of display main bodies.

SUMMARY

Therefore, it is an aspect of the exemplary embodiments to provide a display device and a terminal having the same which stably support a display main body and improve a height adjustment structure of the display main body so as to be applicable to display main bodies having various sizes.

Additional aspects of the exemplary embodiments will be set forth in part in the description which follows and, in part, will be obvious from the description, or may be learned by practice of the exemplary embodiments.

In accordance with one aspect of the present exemplary embodiments, a terminal includes a base including a circuit board provided therein, and upper and lower housings, a support provided with one side combined with at least a portion of the lower housing and the other side having a head part for combination with a display main body, a first hole located on the upper housing and provided for combination with the support, and a second hole located on the circuit board and provided for combination with the support.

A combining part for combination with the support may be provided on the lower housing at a position which corresponds to the first hole and the second hole.

The combing part may protrude in the inward direction of the lower housing.

The support may include a height adjustment, the height of which is adjustable.

The terminal may further include a locking mechanism combined with one side of the height adjustment and fixing the position of the height adjustment.

The locking mechanism may include a locking body part combined with the support unit, and an operation member combined with the locking body part and fixing the lock.

The operation member may be combined with the locking body part so as to be rotatable relative to the locking body part.

A movable part may be provided at one side of the support contacting the operation member and may fix the height adjustment according to movement of the operation member.

An elastic member configured to absorb shock due to fixation of the height adjustment may be combined with the inner surface of the movable part.

The height adjustment may adjust the height of the support through the use of a gas cylinder.

The terminal may further include a fixing mechanism combined with one side of the support and configured to fix a connection member which connects the main body of the display with the base.

The fixing mechanism may include a fixing body part combined with the support, and a holder part extending from the fixing body part and fixing the connection member.

Plural port holes with which plural ports for operation of the base and the display main body are combined, may be located at one side of the base.

In accordance with another aspect of the exemplary embodiments, a terminal includes a base including a circuit board provided therein, a support provided with one side combined with at least a portion of the base and the other side having a head part for combination with a display main body, a first hole located on one side of the base and configured for combination with the support, a second hole located on the circuit board and configured to combine with the support, and a locking mechanism configured to adjust the height of the support, and configured to be combined with the support so as to fix the support.

The terminal may further include a fixing mechanism combined with one side of the support and fixing a connection member which connects the display main body and the base.

The base may further include upper and lower housings, and the first hole may be located in the upper housing.

The support may pass through the first hole and the second hole and may be combined with the lower housing.

The locking mechanism may include a locking body part combined with the support, and an operation member may be rotatably combined with the locking body part so as to fix the locking mechanism.

In accordance with a further aspect of an exemplary embodiment, a display device includes a display main body, a support which supports the display main body, a base with which the lower portion of the support is combined, a height adjustment provided at least at a portion of the support so as to adjust the height of the support, and a locking mechanism fixing the height of the height adjustment, and including a locking body part combined with the support and an operation member combined with the locking body part and fixing the locking mechanism.

The support may include an outer housing and an inner housing, and a gas cylinder configured to adjust the height of the support may be located at the inside of the inner housing.

The locking mechanism may be combined with the outer surface of the inner housing of the support, and a movable part may be provided at at least a portion of the inner housing contacting the operation member.

An elastic member configured to absorb shock due to contact with the gas cylinder may be combined with the inner surface of the movable part.

The display device may further include a fixing mechanism combined with one side of the support and fixing a connection member connecting the display main body and the base.

An exemplary embodiment may further provide a display device including: a support adapted for supporting a main body of a display; a height adjustment configured to be located at least at a portion of the support so as to adjust the height of the support; and a locking mechanism configured to fix the height of the height adjustment.

The display device may further include a locking body part combined with the support; and an operation member combined with the locking body part and configured to lock the locking mechanism.

The support may include an outer housing and an inner housing and a gas cylinder configured to adjust the height of the support is located at the inside of the inner housing.

The locking mechanism may be combined with the outer surface of the inner housing of the support, and a movable part is provided at least at a portion of the inner housing contacting the operation member.

BRIEF DESCRIPTION OF THE DRAWINGS

These and/or other aspects of the exemplary embodiments will become apparent and more readily appreciated from the following description, taken in conjunction with the accompanying drawings of which.

DETAILED DESCRIPTION OF THE EXEMPLARY EMBODIMENTS

Figure 1:
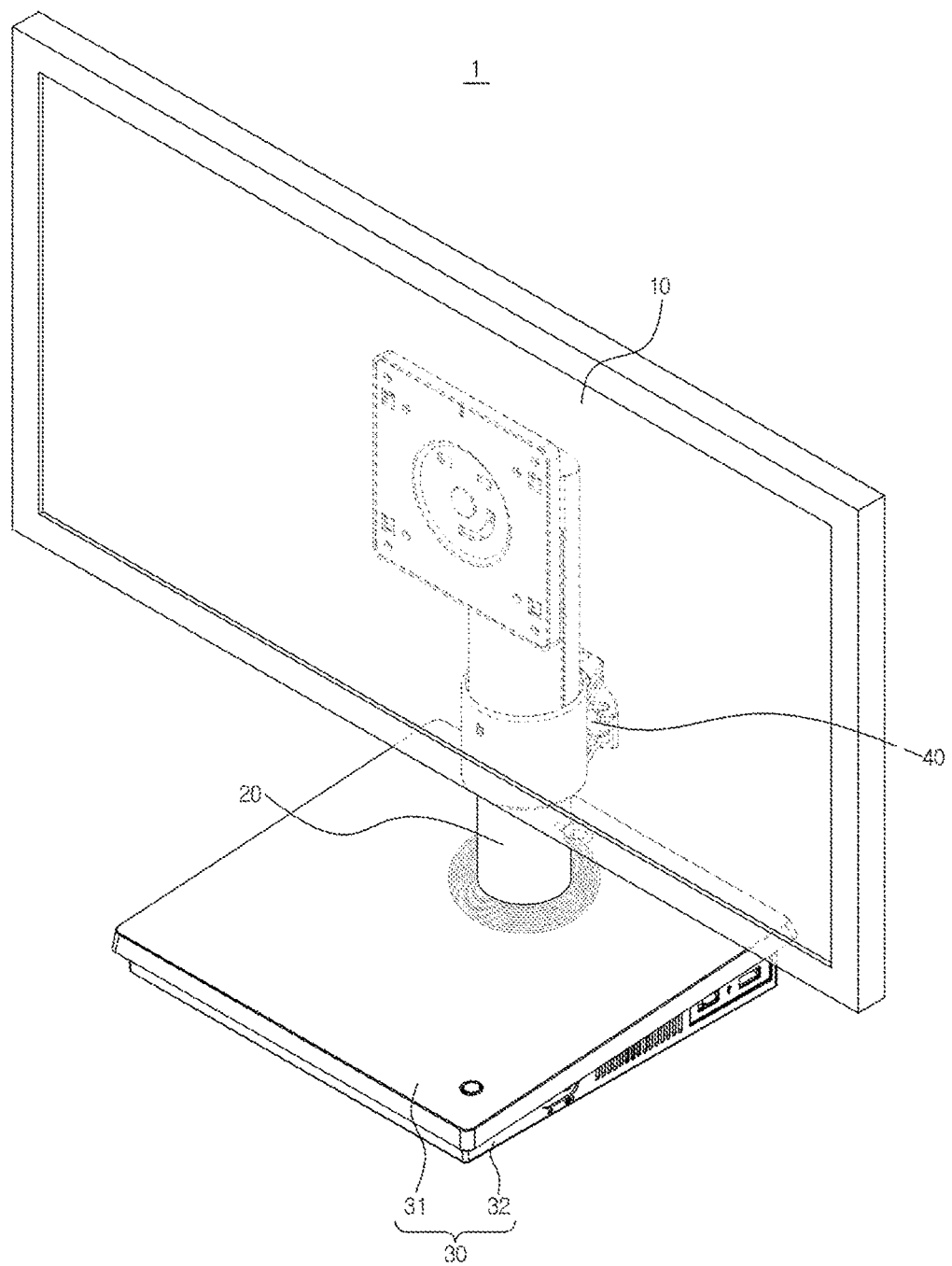
FIG. 1 is a perspective view which illustrates the front surface of a terminal in accordance with one exemplary embodiment.

Reference will now be made in detail to the exemplary embodiments, examples of which are illustrated in the accompanying drawings, wherein like reference numerals refer to like elements throughout.

Figure 2:
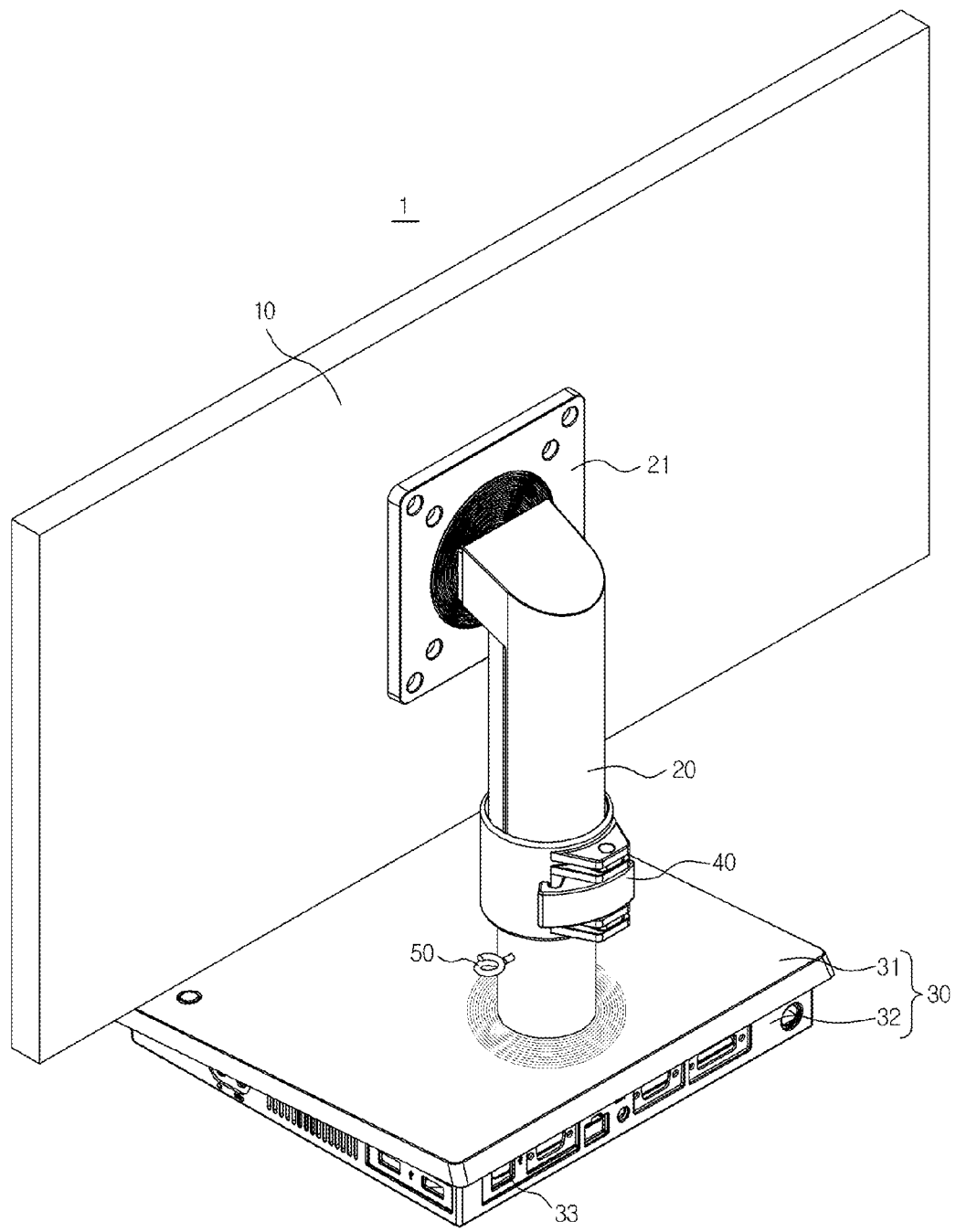
FIG. 2 is a perspective view which illustrates the rear surface of the terminal in accordance with an exemplary embodiment.

FIG. 1 is a perspective view illustrating the front surface of a terminal in accordance with one exemplary embodiment, and FIG. 2 is a perspective view illustrating the rear surface of the terminal in accordance with an exemplary embodiment.

As shown in FIGS. 1 and 2, a terminal 1 in accordance with this exemplary embodiment includes a display main body 10 displaying an image, a support 20 supporting the display main body 10, and a base 30 combined with the lower portion of the support 20. A controller, such as a circuit board, may be located in the base 30. In response to a device including a controller, the device is defined as a terminal, and in response to a device not including a controller, the device is defined as a display device.

The terminal 1 may be used as a cloud computing terminal which is connected to a server (not shown), may perform various tasks, and may store the performed tasks in the server (not shown). In this case, pieces of information physically located at different positions of respective terminals may be stored in the server (not shown), and thus these pieces of information may be integrated and managed.

The display main body 10 is combined with one side of the support 20, and the other side of the support 20 is combined with the base 30. The support 20 may include a head part 21 combined with the display main body 10.

The support 20 may include a height adjustment so as to adjust the height of the support 20. The height adjustment may be in a first state, i.e., a combined state in which the height of the support 20 is fixed, and in a second state, i.e., a released state in which the height of the support 20 is adjustable. A locking mechanism 40 configured to fix the height of the support 20 may be combined with one side of the support 20. This will be described later.

Further, a safety pin 50 may be combined with one side of the support 20. The safety pin 50 prevents sudden adjustment of the height of the terminal 1 when a user adjusts the height of the terminal 1. Since the safety pin 50, in addition to the locking mechanism 40, fixes the height of the support 20, the height of the support 20 may be adjusted by releasing the locking 40 after the locking 40 is combined with the support 20 and removing the safety pin 50. The safety pin 50 may prevent a safety accident which may be generated in an initial stage.

The base 30 may include an upper housing 31 and a lower housing 32. Port holes 33 with which plural ports (not shown) for operation of the controller within the base 30 and the display main body 10 are combined, may be located at one side of the base 30. A power cord combining hole, a local area network (LAN) cable combining hole, an USB combining hole, etc. may be provided as port holes 33. Although FIGS. 1 and 2 illustrate the port holes 33 as being provided on the rear surface of the lower housing 32, the position of the port holes 33 is not limited thereto.

Figure 3:
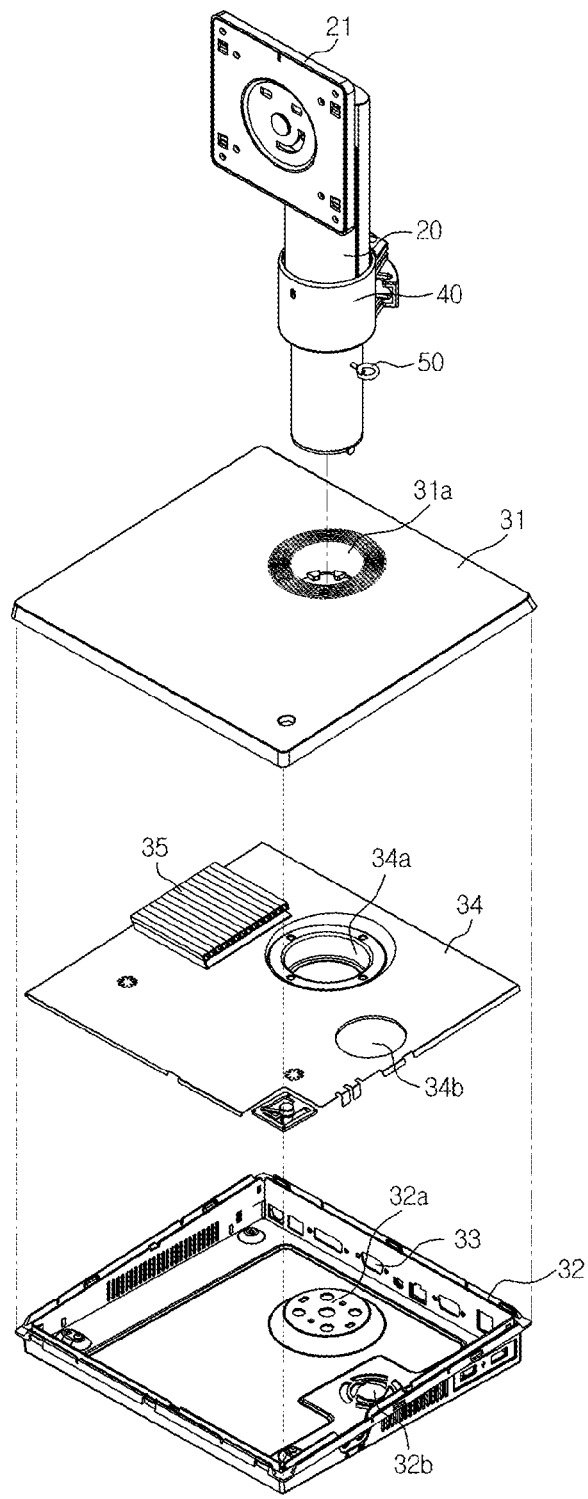
FIG. 3 is an exploded perspective view of a base of the terminal in accordance with an exemplary embodiment.

FIG. 3 is an exploded perspective view of the base of the terminal in accordance with an exemplary embodiment.

The terminal 1, including the controller may include a circuit board 34 within the base 30. The circuit board 34 may be located between the upper housing 31 and the lower housing 32. A first hole 31a configured for combination with the support 20 is provided on the upper housing 31. A second hole 34a for combination with the support 20 is provided on the circuit board 34. The first hole 31a and the second hole 34a may be provided at corresponding positions. A combining part 32a with which the support 20 is combined may be provided on the lower housing 32. Thereby, the support 20 is combined with the combining part 32a via the first hole 31a and the second hole 34a.

The combining part 32a may protrude in the inward direction of the base 30, in order to increase the rigidity of base 30 due to combination of the support 20 with the base 30. The support 20 may be combined with the lower housing 32 using combining members (not shown), such as screws, from a region under the lower housing 32.

The circuit board 34 serves as the controller. A device preventing the circuit board 34 from overheating may be provided on the circuit board 34. For example, a heat sink 35 preventing raising of the temperature of the circuit board 34 may be provided on the circuit board 34. Further, an air blower fan (not shown) configured to absorb heat from the circuit board 34 and then discharging the heat may be located on the lower housing 32. In order to allow the air blower fan (not shown) to absorb heat from the circuit board 34, a third hole 34b may be provided on the circuit board 34. Further, in order to allow the air blower fan (not shown) to discharge the absorbed heat, an air blowing hole 32b may be provided on the lower housing 32.

Figure 4:
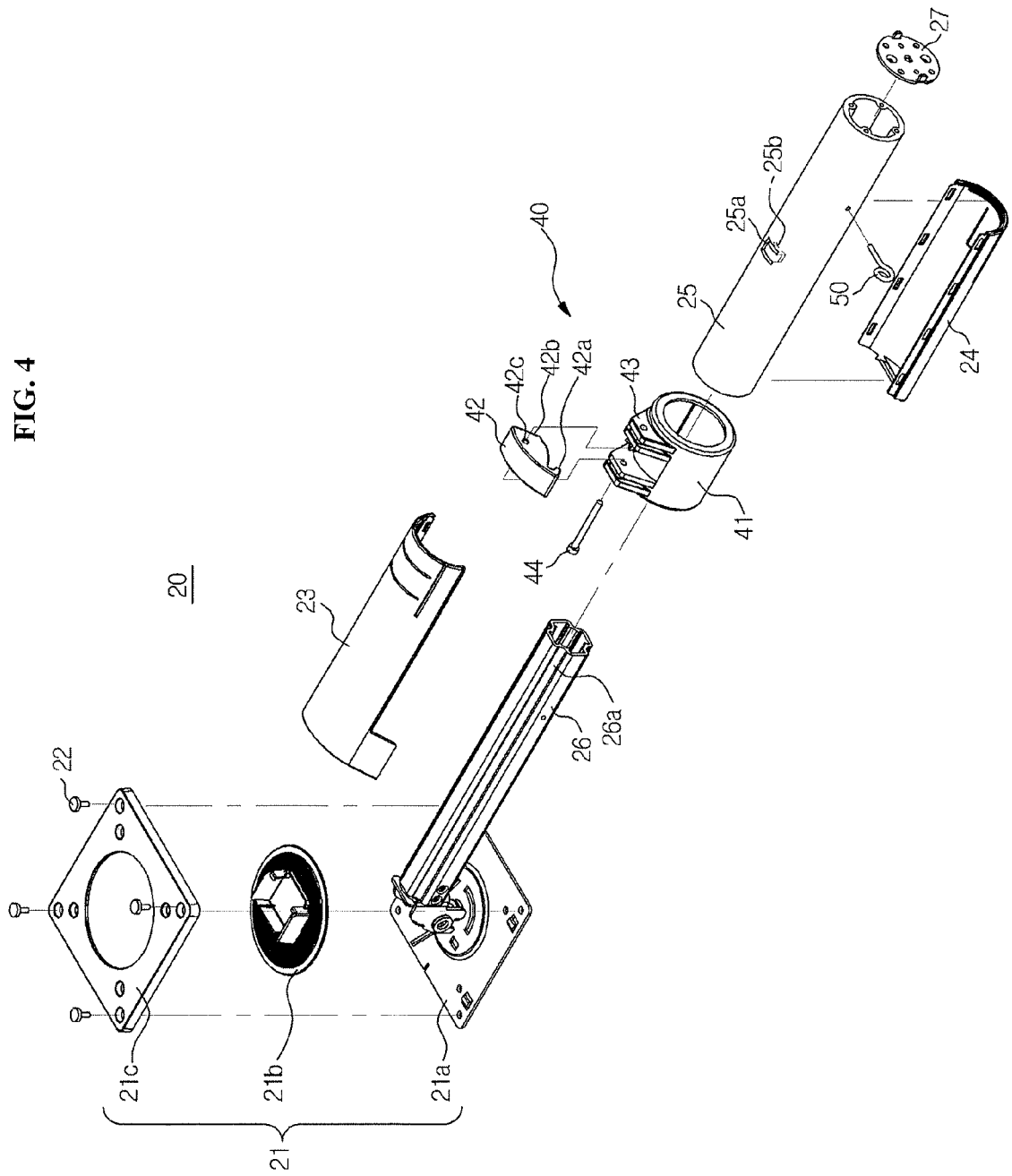
FIG. 4 is an exploded perspective view of a support in accordance with an exemplary embodiment.

FIG. 4 is an exploded perspective view of the support in accordance with the embodiment of an exemplary present invention.

As shown in FIG. 4, the support 20 includes an outer tub 23, 24 and an inner tub 25. The outer tub 23, 24 includes a front outer tub part 24 serving as the front surface of the support 20, and a rear outer tub part 23 serving as the rear surface of the support 20. The outer tub 23 and 24 may surround at least a portion of the inner tub 25. That is, when the support 20 moves in the downward direction, and thus the length of the support unit 20 decreases, the outer tub 23, 24 may completely surround the inner tub 25, but when the support 20 moves in the upward direction and thus the length of the support 20 increases, the outer tub 23, 24 does not completely surround the inner tub 25. A combining panel 27 to combine the support 20 with the base 30 is combined with the lower end of the inner tub 25. The combining part 32a of the lower housing 32 and the combining panel 27 of the support 20 are combined with each other through fastening members (not shown).

A height adjustment configured to adjust the height of the support 20 may be located within the inner tub 25. The height adjustment may adjust the height of the support 20 using a gas cylinder (not shown). A cover member 26 may be located at the outside of the gas cylinder (not shown). The cover member 26 may be inserted into the inner tub 25 along grooves 26a formed on the surface of the cover member 26, and thus be moved in the downward direction or the upward direction. In order to guide movement of the cover member 26, ribs (not shown) having a shape which corresponds to the shape of the grooves 26a may be provided on the inner surface of the inner tub 25.

Accordingly, in response to a user desiring to move the display main body 10 in the downward direction, the gas cylinder (not shown) is compressed and the cover member 26 slides along the inner tub 25 in the downward direction. When the user stops movement of the display main body 10 at a desired position, the user may fix the support 20 using the locking mechanism 40.

One side of the support 20 may be extended to the head part 21 with which the display main body 10 is combined. The head part 21 may include a front panel 21a, a rear panel 21c, and a guide panel 21b with which the support 20 is combined. The guide panel 21b may be combined with the front panel 21a, and then, the rear panel 21c may be combined with the front panel 21a through fastening members 22. Since the guide panel 21b protrudes upward from the rear panel 21c, the support 20 may be combined with the guide panel 21b after combination of the rear panel 21c with the front panel 21a.

The locking mechanism 40 configured to fix the support 20, may be located at one side of the support 20. The locking mechanism 40 may include a locking body part 41 combined with the support 20, and an operation member 42 combined with the locking body part 41 and fixing the locking mechanism 40. The locking mechanism 40 will be described later. A movable part 25a may be located at a portion of the inner tub 25 contacting the locking mechanism 40. In more detail, the movable part 25a is located at a portion of the inner tub 25 contacting the operation member 42, and in accordance with one exemplary embodiment, the movable part 25a is formed by cutting a portion of the surface of the inner tub 25 and may thus have a some degree of movability.

Figure 5:
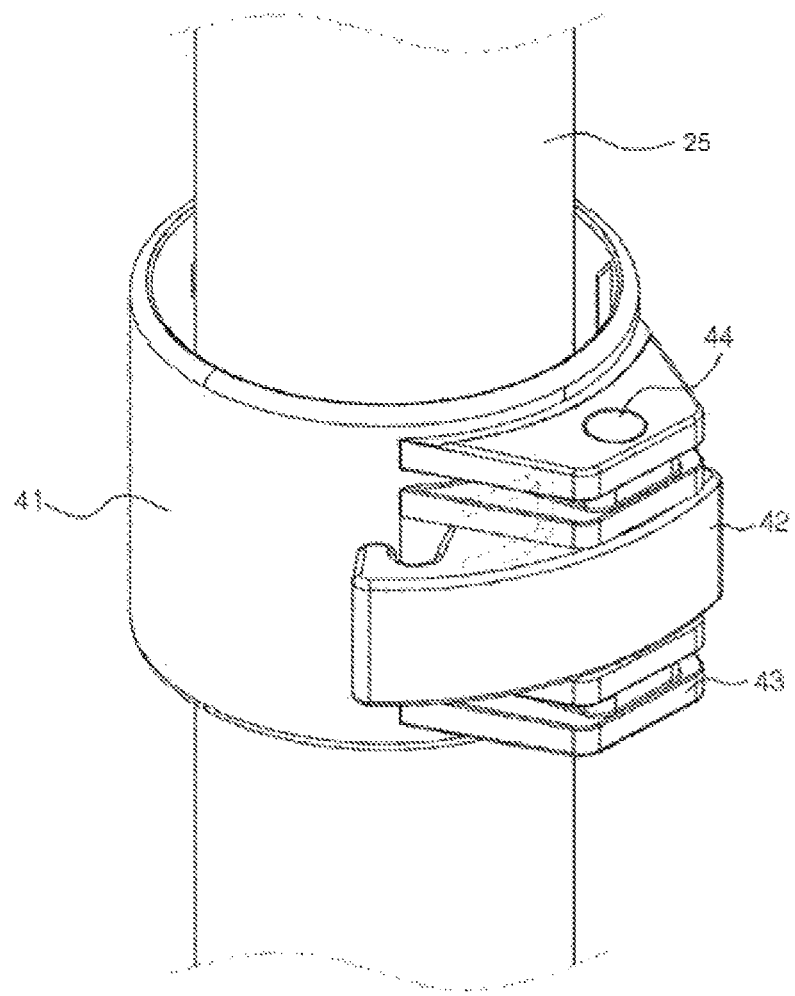
FIG. 5 is a view which illustrates a locking mechanism in a combined state in accordance with an exemplary embodiment.
Figure 6:
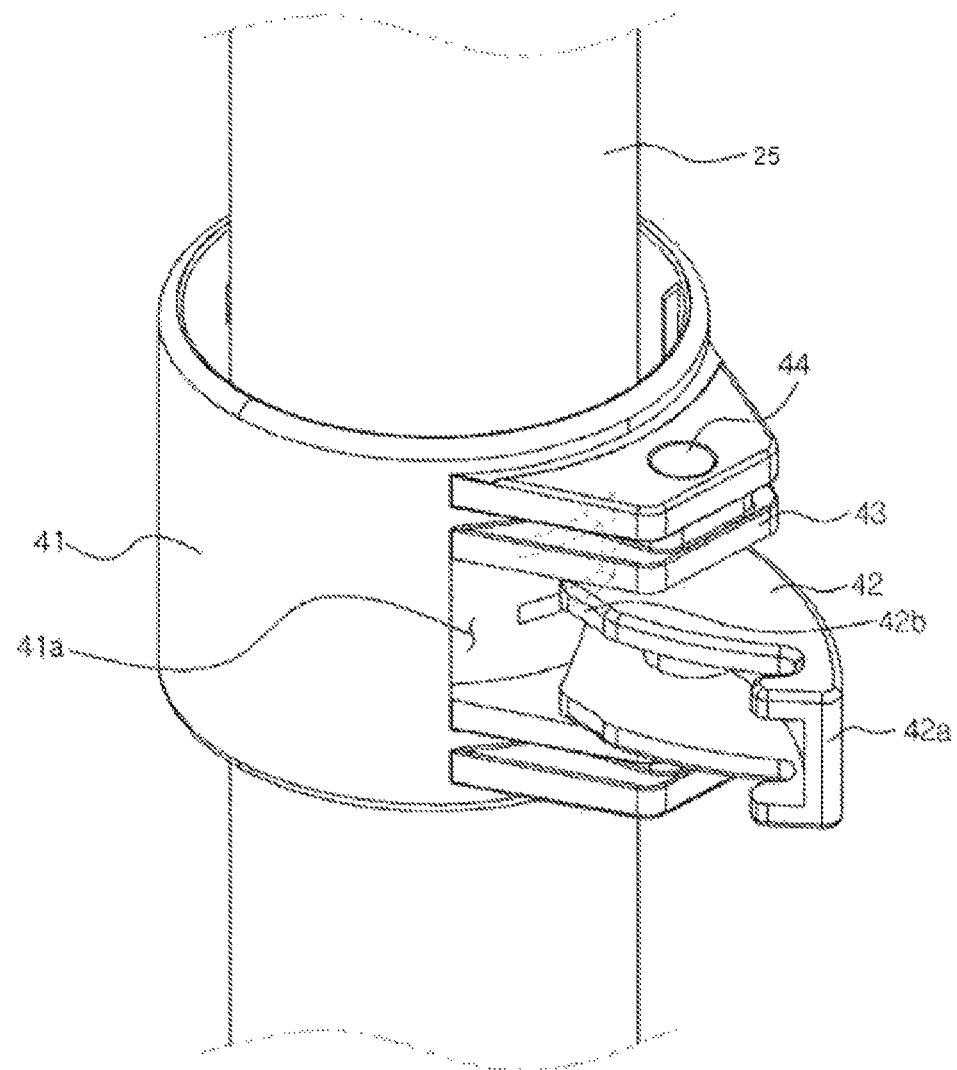
FIG. 6 is a view which illustrates the locking mechanism in a released state in accordance with an exemplary embodiment.
Figure 7:
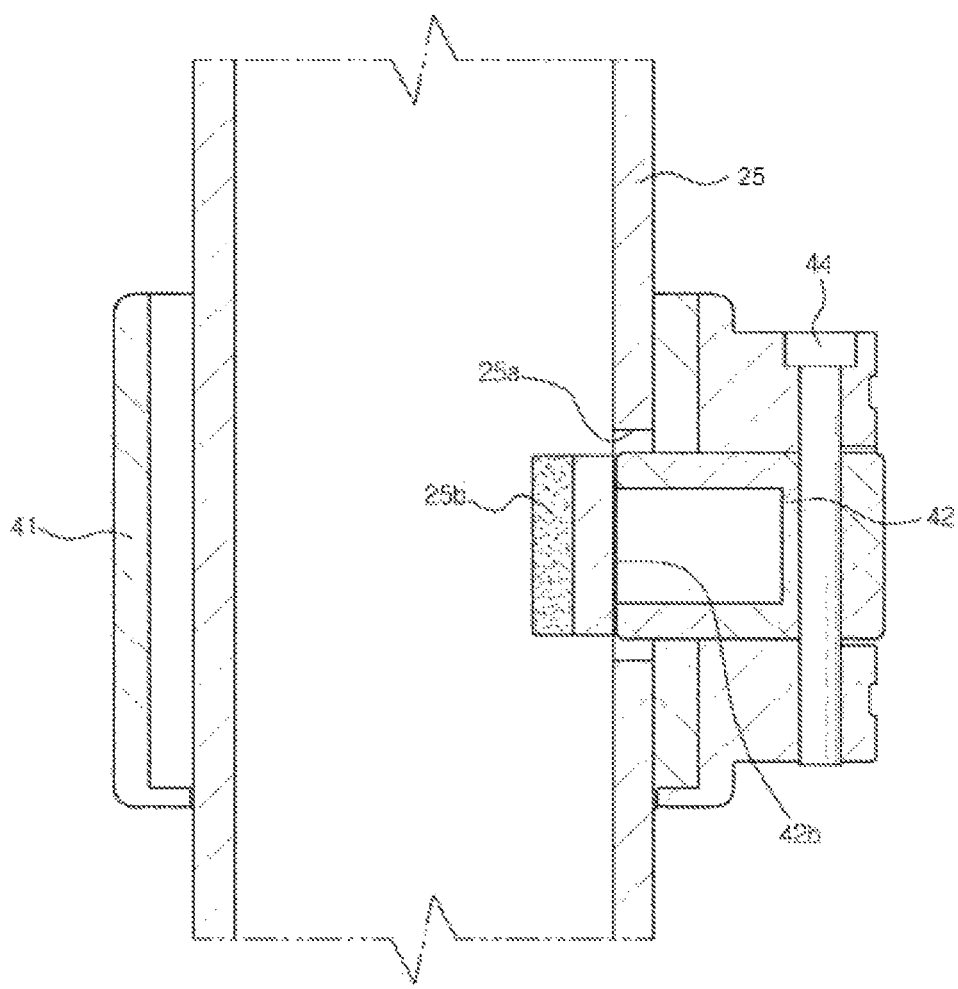
FIG. 7 is a cross-sectional view which illustrates the locking mechanism in the combined state in accordance with an exemplary embodiment.
Figure 8:
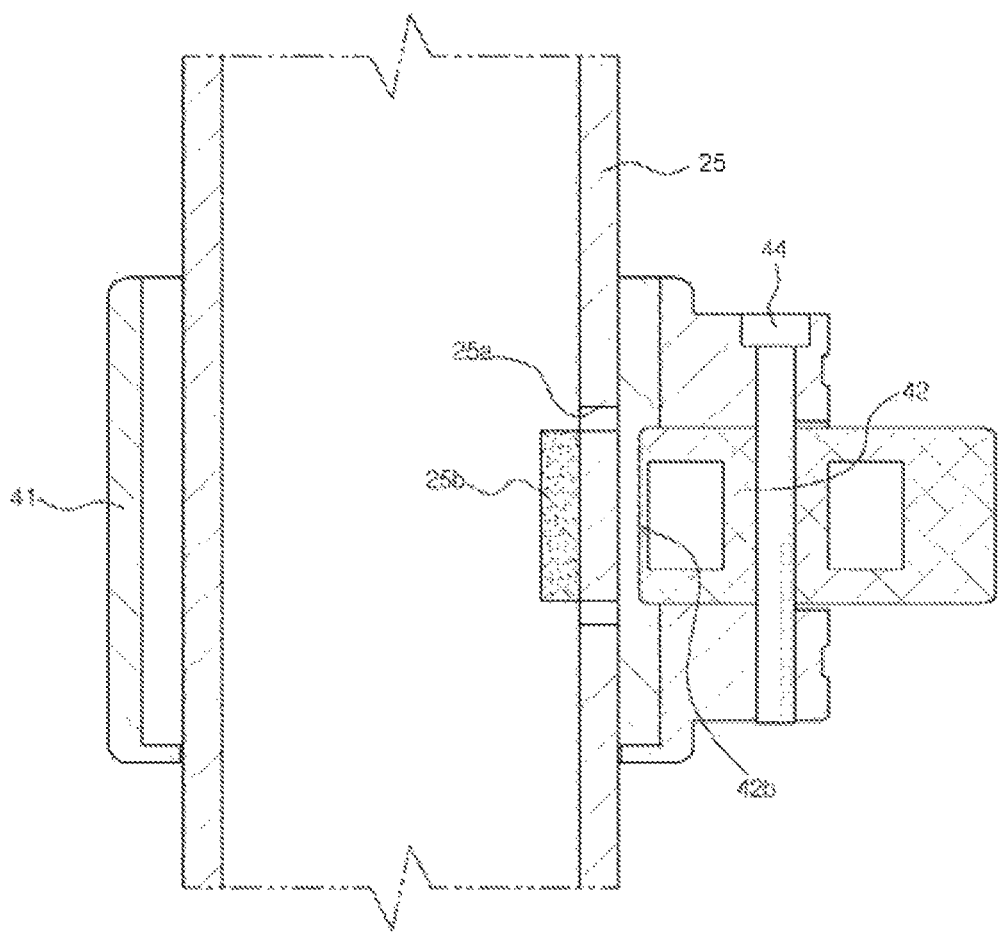
FIG. 8 is a cross-sectional view which illustrates the locking mechanism in the released state in accordance with an exemplary embodiment.

FIG. 5 is a view which illustrates the locking mechanism in the combined state in accordance with an exemplary embodiment, FIG. 6 is a view which illustrates the locking mechanism in the released state in accordance with an exemplary embodiment, FIG. 7 is a cross-sectional view which illustrates the locking mechanism in the combined state in accordance with an exemplary embodiment, and FIG. 8 is a cross-sectional view which illustrates the locking mechanism in the released state in accordance with an exemplary embodiment.

As shown in FIGS. 5 to 8, the locking body part 41 is provided in a ring shape and thus that the support 20 is inserted into the ring-shaped locking body part 41, but the shape of the locking body part 41 is not limited thereto. At least a portion of the locking body part 41 with which the operation member 42 is combined may include an opening 41a (FIG. 6). The opening 41a allows the operation member 42 to press the inner tub 25 with which the locking body part 41 is combined. Since the locking mechanism 40 is combined with one side of the inner tub 25 and the movable part 25a is provided on the surface of the inner tub 25 at the position at which the locking 40 is located, the locking 40 may fix the height adjustment by effectively pressing the gas cylinder (not shown) within the inner tub 25.

The movable part 25a may be provided by cutting the surface of the inner tub 25. Since the movable part 25a is formed by cutting a designated portion of the surface of the inner tub 25, the movable part 25a may have more than a designated degree of movability. Further, an elastic member 25b may be located at the inside of the movable part 25a. The elastic member 25b provided at the inside of the movable part 25a presses the gas cylinder (not shown) located within the inner tub 25 when the locking mechanism 40 fixes the support 20, and movement of the gas cylinder (not shown) may be stopped due to friction between the gas cylinder (not shown) and the elastic member 25b. Further, the elastic member 25b may absorb shock due to contact with the gas cylinder (not shown). The elastic member 25b may be formed of a flexible material, for example, rubber.

The locking mechanism 40 may include the operation member 42 operated by a user to fix the height adjustment. The operation member 42 may be hinged to the locking body part 41 so as to be rotated relative to the locking body part 41. The locking body part 41 includes hinge combining parts 43 with which the operation member 42 is combined, and the hinge combining parts 43 and a fastening hole 42c of the operation member 42 are combined through a rotary pin 44.

The operation member 42 includes a first operation part 42a combined with the surface of the locking body part 41, and a second operation part 42b combined with the surface of the inner tub 25. The second operation part 42b may be provided in a shape, a portion of which is protruded, and such a shape serves to guide pressing of the inner tub 25. The second operation part 42b may press one side of the movable part 25a provided on the surface of the inner tub 25, and the elastic member 25b located on the other side of the movable part 25a may press the gas cylinder (not shown).

Figure 9:
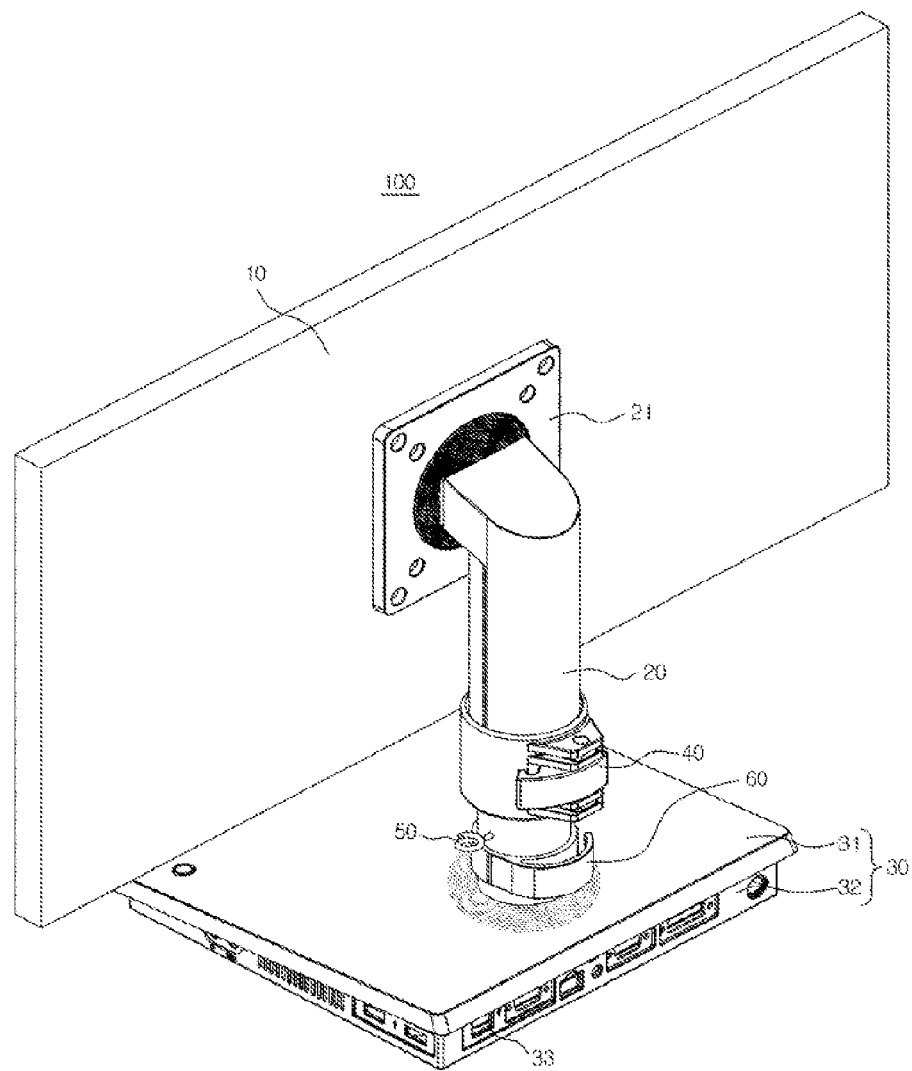
FIG. 9 is a perspective view which illustrates the rear surface of a terminal in accordance with another exemplary embodiment.
Figure 10:
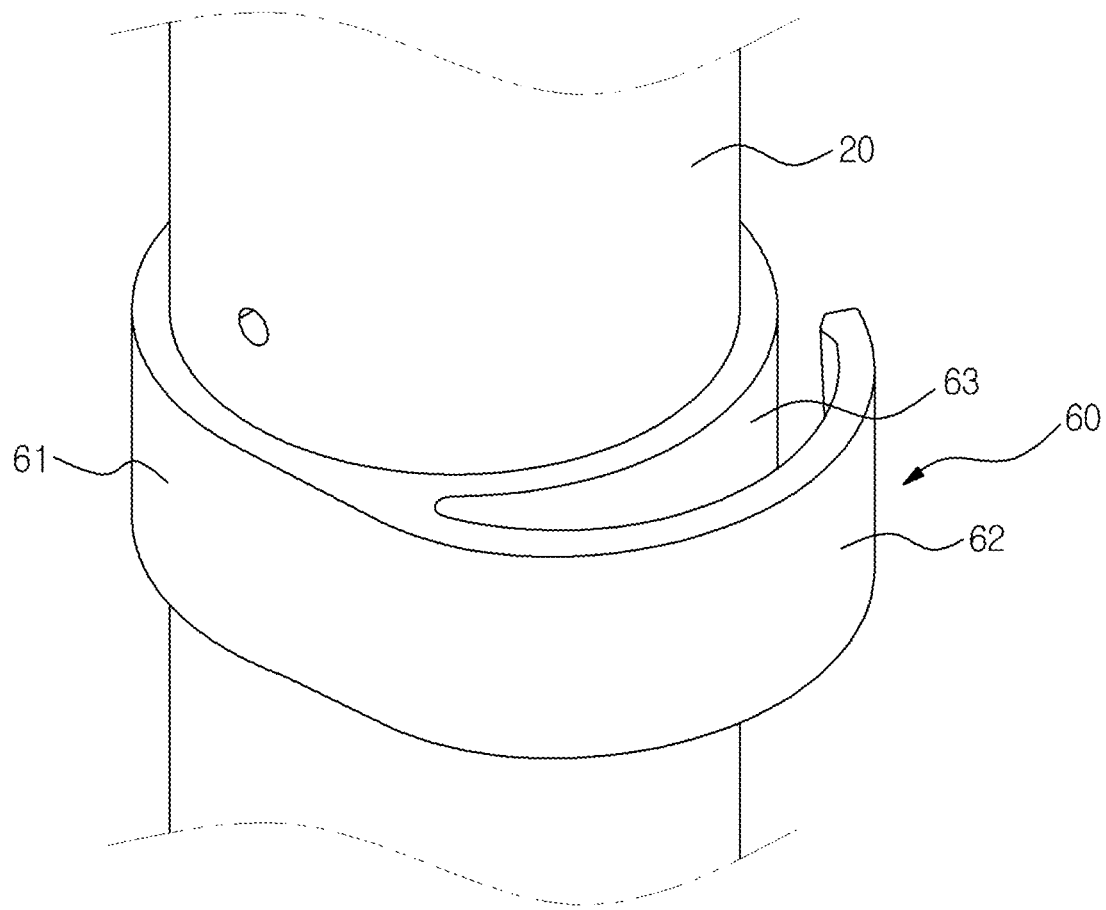
FIG. 10 is an enlarged view of a fixing mechanism in accordance with an exemplary embodiment.

FIG. 9 is a perspective view which illustrates the rear surface of a terminal in accordance with another exemplary embodiment, and FIG. 10 is an enlarged view of a fixing mechanism in accordance with an exemplary embodiment.

As shown in FIGS. 9 and 10, a terminal 100 in accordance with this exemplary embodiment may further include a fixing mechanism 60. Hereinafter, some parts in this embodiment which are substantially the same as those in the previous exemplary embodiment shown in FIGS. 1 to 8 are denoted by the same reference numerals even though they are depicted in different drawings, and a detailed description thereof will thus be omitted because it is considered to be unnecessary. A connection member (not shown) connecting the display main body 10 and the base 30 may be provided, and the fixing mechanism 60 serves to fix such a connection member (not shown).

The fixing mechanism 60 may include a fixing unit body part 61 combined with the support 20, and a holder part 62 extended from the fixing body part 61 to fix the connection member (not shown). The fixing body part 61 may be provided in a ring shape, and may thus be combined with the support 20 such that the support 20 is inserted into the ring-shaped fixing body part 61. The holder part 62 is extended from the fixing body part 61. The holder part 62 may be separated from the fixing body part 61 by a designated interval. Therefore, the connection member (not shown) may be inserted into a receiving part 63 provided between the holder part 62 and the fixing body part 61. In order to receive various connection members (not shown) having different thicknesses, the fixing mechanism 60 may be formed of a flexible material. Thereby, the connection member (not shown) which may sag between the display main body 10 and the base 30 is arranged properly, and thus user convenience may be improved In addition, the terminal 100 may have a pleasing external appearance to a user.

As is apparent from the above description, a display device and a terminal having the same in accordance with an exemplary embodiment may increase combining forces between a support and a base and may use the same support and base in main bodies having various sizes, thus simplifying the manufacturing process and reducing the cost of parts and assembly.

Although a few exemplary embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A terminal comprising:
    a base including a circuit board, and upper and lower housings;
    a support configured with one side combined with at least a portion of the lower housing and the other side having a head part combined with a main body of a display, wherein the support is configured to move to adjust a height of the support;
    a locking mechanism configured to fix the height of the support;
    a first hole located on the upper housing and configured to be combined with the support; and
    a second hole located on the circuit board and configured to be directly combined with the support,
    wherein the support comprises an inner housing comprising a movable part that is formed by cutting a portion of the inner housing,
    wherein the locking mechanism comprises an operation member configured to lock the locking mechanism by pressing against the movable part, and
    wherein the support extends through the first hole on the upper housing and the second hole located on the circuit board and the support is combined with the lower housing.

2. The terminal according to claim 1, wherein a combining part for combination with the support is provided on the lower housing at a position which corresponds to the first hole and the second hole.

3. The terminal according to claim 2, wherein the combining part protrudes in an inward direction of the lower housing.

4. The terminal according to claim 1, wherein the locking mechanism includes a locking body part combined with the support, and the operation member is combined with the locking body part and fixes the locking mechanism.

5. The terminal according to claim 4, wherein the operation member is combined with the locking body part so as to be rotatable relative to the locking body part.

6. The terminal according to claim 4, wherein an elastic member configured to absorb shock due to fixation of the height of the support is combined with an inner surface of the movable part.

7. The terminal according to claim 1, further comprising a fixing mechanism combined with one side of the support and fixing a connection member connecting the display main body and the base.

8. The terminal according to claim 7, wherein the fixing mechanism includes a fixing body part combined with the support, and a holder extending from the fixing body part and fixing the connection member.

9. The terminal according to claim 1, wherein plural port holes are located at one side of the base with which plural ports for operation of the base and the display main body are combined.

10. The terminal according to claim 1, further comprising:
    a safety pin disposed between the locking mechanism and the support to fix a height of the support.

11. A terminal comprising:
    a base including a circuit board provided therein, and upper and lower housings;
    a support with one side combined with at least a portion of the base and the other side having a head part configured for combination with a display main body, wherein the support is configured to move to adjust a height of the support;
    a first hole located on one side of the base and configured to be combined with the support;

a second hole located on the circuit board and configured to be directly combined with the support; and a locking mechanism provided to lock the height of the support, and combined with the support so as to lock the support, wherein the support comprises an inner housing comprising a movable part that is formed by cutting a portion of the inner housing, wherein the locking mechanism comprises an operation member configured to lock the locking mechanism by pressing against the movable part, and wherein the support extends through the first hole on the upper housing and the second hole located on the circuit board and the support is combined with the lower housing.

12. The terminal according to claim 11, further comprising a fixing mechanism combined with one side of the support and fixing a connection member connecting the display main body with the base.

13. The terminal according to claim 11, wherein the locking mechanism includes a locking body part combined with the support, and the operation member is rotatably combined with the locking body part so as to lock the locking mechanism.

14. The terminal according to claim 11, further comprising:

a safety pin disposed between the locking mechanism and the support to fix the height of the support.

15. A display device comprising:

a display main body;

a support configured to support the display main body and configured to move to adjust a height of the support;

a base configured to be combined with a lower portion of the support and including a circuit board and upper and lower housings; and a locking mechanism that comprises a locking body part and an operation member, and is configured to fix the height of the support;

wherein the support comprises an inner housing comprising a movable part that is formed by cutting a portion of the inner housing, and wherein the operation member is configured to lock the locking mechanism by pressing against the movable part, and wherein the support extends through a first hole on the upper housing and a second hole located on the circuit board and the support is combined with the lower housing.

16. The display device according to claim 15, wherein the support includes an outer housing.

17. The display device according to claim 16, wherein the locking mechanism is combined with the outer surface of the inner housing of the support.

18. The display device according to claim 17, wherein an elastic member configured to absorb shock due to fixation of the height of the support is combined with an inner surface of the movable part.

19. The display device according to claim 15, further comprising a fixing mechanism combined with one side of the support and fixing a connection member connecting the display main body and the base.

20. The display device according to claim 15, further comprising:

a safety pin disposed between the locking mechanism and the support to fix the height of the support.

* * * * *